(12) United States Patent
Rezayee

(10) Patent No.: US 9,070,062 B2
(45) Date of Patent: Jun. 30, 2015

(54) STREAMLINED APPARATUS AND METHODS FOR RFID COMMUNICATION

(75) Inventor: Afshin Rezayee, Richmond Hill (CA)

(73) Assignee: Square, Inc., San Francisco, CA (US)

( * ) Notice: Subject to any disclaimer, the term of this patent is extended or adjusted under 35 U.S.C. 154(b) by 274 days.

(21) Appl. No.: 13/544,326

(22) Filed: Jul. 9, 2012

(65) Prior Publication Data

US 2013/0169416 A1    Jul. 4, 2013

Related U.S. Application Data

(60) Provisional application No. 61/506,387, filed on Jul. 11, 2011.

(51) Int. Cl.
| | | |
|---|---|---|
| *H04Q 5/22* | (2006.01) | |
| *G08C 19/16* | (2006.01) | |
| *H04Q 1/30* | (2006.01) | |
| *H03C 1/52* | (2006.01) | |
| *H04B 1/04* | (2006.01) | |
| *G06K 19/07* | (2006.01) | |
| *H04L 27/12* | (2006.01) | |
| *H04L 27/36* | (2006.01) | |
| *G06K 7/10* | (2006.01) | |
| *H04B 1/38* | (2015.01) | |
| *H03F 1/32* | (2006.01) | |

(52) U.S. Cl.
CPC ............ *G06K 19/0723* (2013.01); *H04L 27/12* (2013.01); *H04L 27/361* (2013.01); *H04B 1/38* (2013.01); *H03F 1/3247* (2013.01); *G06K 7/10009* (2013.01)

(58) Field of Classification Search
USPC ............... 340/10.1, 10.52, 572.1, 572.9, 551, 340/572.7, 539, 10.4, 870.18, 538.11, 340/12.33, 10.33, 10.51, 574.4; 455/338, 455/336, 215, 339, 41.2, 78, 73, 456.2, 455/67.14, 107, 126, 91, 453, 102; 342/195, 51, 42; 327/110, 316, 230; 332/108, 128; 330/105

See application file for complete search history.

(56) References Cited

U.S. PATENT DOCUMENTS

| | | | |
|---|---|---|---|
| 7,054,595 B2 | 5/2006 | Bann | |
| 7,525,438 B2 | 4/2009 | Hyde et al. | |
| 7,689,195 B2 | 3/2010 | Wu et al. | |
| 2006/0186995 A1* | 8/2006 | Wu et al. | 340/10.1 |
| 2007/0013486 A1 | 1/2007 | Yeoh et al. | |
| 2007/0060221 A1* | 3/2007 | Burgan et al. | 455/575.7 |
| 2008/0089453 A1* | 4/2008 | Komatsu | 375/346 |
| 2009/0325511 A1* | 12/2009 | Kim | 455/84 |
| 2010/0093279 A1* | 4/2010 | Linsky et al. | 455/41.2 |
| 2011/0248825 A1* | 10/2011 | Hamel et al. | 340/10.1 |
| 2012/0300870 A1* | 11/2012 | Dickey | 375/295 |

OTHER PUBLICATIONS

International Search Report and Written Opinion dated Oct. 15, 2012, International Application No. PCT/CA2012/000659.
International Preliminary Report on Patentability dated Jan. 14, 2014, International Application No. PCT/CA2012/000659.

* cited by examiner

*Primary Examiner* — Mirza Alam
(74) *Attorney, Agent, or Firm* — Bereskin & Parr LLP/S.E.N.C.R.L., s.r.l

(57) ABSTRACT

Methods and devices for receiving a data signal transmitted via load modulation, by detecting current supplied in an amplifier feeding the antenna of the device which transmits the carrier signal.

11 Claims, 2 Drawing Sheets

STREAMLINED APPARATUS AND METHODS FOR RFID COMMUNICATION

CROSS-REFERENCE TO RELATED APPLICATION

This application claims the benefit of U.S. Provisional Application No. 61/506,387, filed Jul. 11, 2011. The entire contents of U.S. Provisional Application No. 61/506,387 are hereby incorporated by reference.

FIELD

The embodiments described herein relate to apparatuses and methods for detecting radio-frequency identification (RFID) signals and in particular to apparatuses and methods for detecting RFID signals using an integrated circuit RFID reader.

INTRODUCTION

RFID is a contactless communication technology that uses electromagnetic waves to exchange data between a pair of devices colloquially known as an RFID tag and an RFID reader, for the purposes of automatic identification or tracking of people, animals, products or other objects.

An RFID tag, sometimes also called an RFID label or proximity integrated circuit card (PICC), generally comprises an integrated circuit (IC) and an antenna. Other elements, such as a processor, may also be included or integrated with the IC. The integrated circuit can be used to store and process information, modulate and demodulate a radio-frequency (RF) signal and perform other functions. The antenna is used for transmitting and receiving the RF signal.

Tags may be generally classified as passive or active. Passive tags can be powered via an external electromagnetic field, such as that supplied by the RFID reader. Active tags may use a battery to power the integrated circuit and other elements. In some cases, a battery may be used to assist in transmission to provide greater range, or to power other elements associated with the tag device.

An RFID reader, sometimes also called an RFID interrogator or proximity coupling device (PCD), generally comprises an antenna, an RF transmitter for transmitting a carrier signal, an antenna for coupling the carrier signal with an RFID tag, an RF receiver for detecting the coupled carrier signal and a decoder for extracting the signal information encoded by the RFID tag from the coupled carrier signal. Typically, the same antenna is used both to transmit the carrier signal and detect the coupled signal from the RFID tag. The RFID reader may also modulate the carrier signal to transmit information to the RFID tag. In some cases, the RFID reader may also comprise other elements, such as a microprocessor, to enable more advanced processing or communication.

One widely-used standard for RFID applications is the ISO/IEC 14443 standard, the entire content of which is hereby incorporated by reference. The standard describes different modulation methods, coding schemes and protocol initialization procedures, depending on the type of tag (e.g., Type A or Type B). Other related standards for RFID applications, such as MIFARE and FeliCA, are also in use or development.

In the ISO/IEC 14443 system, tags may have a proximity operating range of less than 10 cm. In the case of credit card-based RFID systems, the operation range may be less than 1 cm. According to ISO/IEC 14443, Type A and Type B RFID tags may not have an active power source and may be powered by the RFID reader via inductive coupling. The RFID reader transmits a 13.56 MHz carrier signal, which is used to power the tags, and which is also modulated by both the reader and card to exchange information.

SUMMARY

In a first broad aspect, there is provided an integrated circuit frontend for use in RFID communication, wherein a data signal is transmitted via load modulation of a primary signal transmitted via an antenna, the frontend comprising: a signal generation unit for generating the primary signal; an integrated filter for reducing undesired harmonics in the primary signal; an amplifier for amplifying the filtered primary signal for transmission via the antenna; a sensor; and a signal extraction unit configured to extract the data signal based on variations in a current level or voltage level detected by the sensor, wherein the variations in the current level or voltage level correspond to the load modulation.

In some embodiments, the sensor detects the current level supplied by the amplifier. In other embodiments, the sensor detects the current level drawn by the signal generation unit.

In some cases, the signal generation unit comprises a modulator, a clock signal generator coupled to the modulator, and a processor coupled to the modulator and the clock signal generator.

In some cases, the integrated filter is a low pass filter. In some cases, the amplifier is a class D amplifier.

In another broad aspect, there is provided an RFID communication unit for detection of a data signal transmitted by a target device via load modulation of a primary signal, the RFID communication unit comprising: a signal generation unit for generating the primary signal; an integrated filter for reducing undesired harmonics in the primary signal; an amplifier for amplifying the filtered primary signal, a sensor; an antenna for electromagnetically coupling output from the amplifier with the target device, such that the load modulation causes variations in a current level or voltage level detected by the sensor via electromagnetic coupling; a signal extraction unit configured to extract the data signal based on the variations in the current level or voltage level detected by the sensor.

In some embodiments, the sensor detects the current level supplied by the amplifier. In other embodiments, the sensor detects the current level drawn by the signal generation unit.

In some cases, the signal generation unit comprises a modulator, a clock signal generator coupled to the modulator, and a processor coupled to the modulator and the clock signal generator.

In some cases, the integrated filter is a low pass filter. In some cases, the amplifier is a class D amplifier.

In some embodiments, the signal generation unit, the integrated filter, the amplifier, the sensor and the signal extraction unit are provided on an integrated circuit.

In some embodiments, the RFID communication unit further comprises a matching network coupled to an input of the antenna.

In some embodiments, the antenna is formed by a speaker coil.

In a further broad aspect, there is provided an RFID communication unit for detection of a data signal transmitted by a target device via load modulation of a primary signal, the RFID communication unit comprising: a signal generation unit for generating the primary signal; an integrated filter for reducing undesired harmonics in the primary signal; a signal extraction unit; a sensor; and a speaker comprising: an amplifier for amplifying the filtered primary signal; and a speaker coil for electromagnetically coupling the primary signal with the target device, such that the load modulation causes variations in the primary signal via electromagnetic coupling; wherein the sensor is configured to detect a current level or voltage level supplied by the amplifier, and wherein the signal extraction unit is configured to extract the data signal based on the variations in the current level or voltage level detected by the sensor.

DRAWINGS

For a better understanding of the various embodiments described herein, and to show more clearly how they may be carried into effect, reference will now be made, by way of example only, to the accompanying drawings which show at least one exemplary embodiment, and in which.

Figure 1:
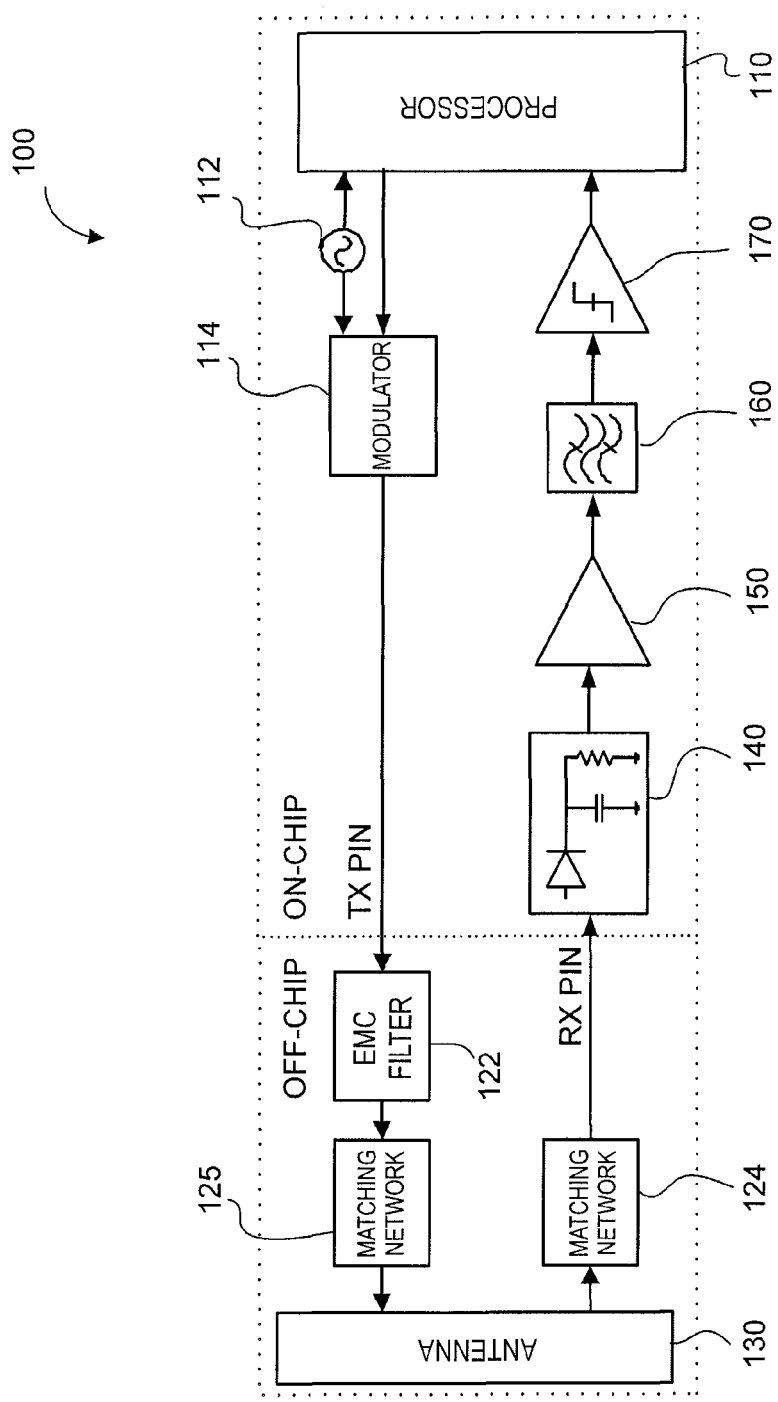
FIG. 1 is a simplified circuit diagram of an example prior art RFID reader.

The skilled person in the art will understand that the drawings, described below, are for illustration purposes only. The drawings are not intended to limit the scope of the applicants' teachings in any way.

DESCRIPTION OF VARIOUS EMBODIMENTS

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail since these are known to those skilled in the art. Furthermore, it should be noted that this description is not intended to limit the scope of the embodiments described herein, but rather is presented for the purposes of describing one or more exemplary implementations.

Conventional RFID reader devices are commonly implemented using an integrated circuit and an external circuit for interfacing with an external antenna. The RFID reader integrated circuit has one or more transmit (TX) outputs, or pins, usable to transmit a primary signal (e.g., a carrier signal or interrogation signal) to an RFID tag, such as a proximity card, via the external circuit and antenna. Further, the RFID reader integrated circuit has one or more receive (RX) inputs, or pins, used to receive the primary signal from the antenna, where the received signal comprises the primary signal and a data signal modulated onto the primary signal by the RFID tag, if any.

The data signal can be modulated onto the primary signal via load modulation by the RFID tag. As the RFID tag and the RFID reader can be electromagnetically coupled, if the RFID tag is placed within the electromagnetic field of the RFID reader's antenna, the RFID tag can draw energy from the electromagnetic field. This power consumption can be measured as a voltage drop in the internal resistance of the RFID reader antenna. Accordingly, by switching a load resistance on or off (to change the amount of energy drawn), the RFID tag can cause a voltage change at the RFID reader antenna. The voltage change can be detected at the RX input of the RFID reader by measuring the voltage variations of the antenna when an RFID tag is modulating the primary signal. Commonly, these voltage variations are sensed at the RX input of the RFID reader antenna using envelope detectors, followed by filters and comparators for comparing the detected input voltage envelope with a reference voltage. Such an approach is described, for example, by Klaus Finkenzeller, "RFID Handbook: Fundamentals and Applications in Contactless Smart Cards and Identification, Second Edition", New York: Wiley & Sons Ltd, 2003, the entirety of which is incorporated herein by reference.

Passive tags in particular may not have sufficient power to produce relatively strong modulation as compared to the primary signal. Accordingly, for low power consumption and high efficiency, RFID tags can transfer data via load modulation at a data rate determined in part by a subcarrier frequency. For ISO/IEC 14443 Type A and Type B systems, the subcarrier frequency is 847.5 kHz, which generally corresponds to a data rate of 847.5 kbps. In other RFID applications, other types of modulation schemes may be employed.

As noted above, modulation can be accomplished by switching a load impedance of the tag on and off. When the tag is within sufficient proximity of the reader, and when the reader is activating the tag by transmitting a primary signal, the load impedance on the tag may be inductively coupled to the reader antenna. Accordingly, the amplitude of the primary signal on the reader antenna will be modulated in response to the switching load impedance of the tag.

A conventional transmitter portion of an RFID reader is well-understood and relatively straightforward to design with given specifications. For example, in order to reduce the electromagnetic noise radiated via the antenna, the external circuit commonly has an electromagnetic compatibility (EMC) filter for filtering the data signal to be transmitted. A typical EMC filter comprises an inductor and a capacitor forming a low-pass filter (LPF).

However, the use of an EMC filter and other off-chip components in the antenna interface imposes design constraints on the RFID reader. Accordingly, there is provided herein an architecture that combines amplifiers, on-chip filters, current sensors and digital post processing to generate a transmitted signal or to recover information from a transmitted signal (e.g., which uses Amplitude Shift-Keying (ASK) modulation) that eliminates the need for EMC filters at the antenna TX pin, and further eliminates the need for a separate antenna RX input.

Accordingly, the architecture described herein provides a novel 13.56 MHz RFID analog frontend design that is suitable for contactless card and contactless reader applications such as ISO/IEC 14443 Type A or Type B.

Referring now to FIG. 1, there is shown a simplified circuit diagram of an example prior art RFID reader. RFID reader 100 demonstrates an analog frontend design targeted for ISO/IEC 14443 applications. Under this approach, the receiver of RFID reader 100 employs an envelope detector to extract the envelope of the carrier for subsequent filtering and amplification, before conversion to a digital signal. RFID reader 100 may comprise a processor 110, clock signal generator 112, modulator 114, EMC filter 122, matching networks 124 and 125, antenna 130, envelope detector 140, amplifier 150, filter 160 and comparator 170.

Processor 110 may be a digital signal processor, field programmable gate array or general purpose processor used to generate signals for encoding and transmitting to an RFID tag, and for decoding signals received from an RFID tag.

The transmitter portion of RFID reader 100 may comprise the processor 110, clock signal generator 112, modulator 114 and the antenna network comprising EMC filter 122, matching networks 124 and 125 and antenna 130. A digital input signal from processor 110, is input to modulator 114 for modulation. Modulator 114 may be an ASK modulator. A clock signal generator 112 may provide a reference signal to be modulated by modulator 114 using the input signal provided by processor 110. For example, for an ISO/IEC 14443 application, the reference signal may be a periodic signal with a frequency of 13.56 MHz (e.g., carrier frequency). The reference signal may be filtered to generate a sinusoidal primary signal.

Processor 110, clock signal generator 112 and modulator 114 may be collectively referred to as a signal generation unit.

Following modulation, the modulated primary signal may pass through an electromagnetic compatibility (EMC) filter 122 and an antenna impedance matching network 125. Subsequently, the modulated primary signal may be transmitted by antenna 130. Typically, the EMC filter, matching network and the antenna are implemented off-chip.

The receive portion of RFID reader 100 detects information from the RFID tag, which may be transmitted by load modulation at the tag and inductively coupled to the same antenna 130.

A rectifier-based envelope detector 140 may be used to extract the carrier envelope, which should represent the baseband signal. In practice, a rectifier-based envelope detector suffers greatly from process variations. For example, in a rectifier-based envelope detector with an RC network, random process variations can alter resistor and capacitor values, resulting in fluctuations in the RC time constant on the order of ±50%. More advanced designs of rectifier-based envelope detectors have been proposed, but the adverse effects of process variation cannot be entirely eliminated due to the direct involvement of passive components in envelope tracking.

Sensitivity and signal to noise ratio (SNR) are generally related according to an inverse relationship. This property significantly complicates the design of a highly sensitive envelope detector. That is, high sensitivity generally leads to poor SNR and high SNR generally leads to low sensitivity.

Following envelope detection, the detected envelope may be further amplified by a variable gain amplifier 150 (VGA) and fed through a bandpass filter 160 to remove out-of-band noise from the signal. A high quality VGA and bandpass filter is typically critical in this approach, due to the low SNR of the detected envelope, as noted above.

Finally, a high gain amplifier or comparator 170 may be used to convert the output of the bandpass filter 160 to a digital signal. The comparator threshold is typically programmable, because this architecture generally cannot fully remove the DC component of the baseband signal.

Figure 2:
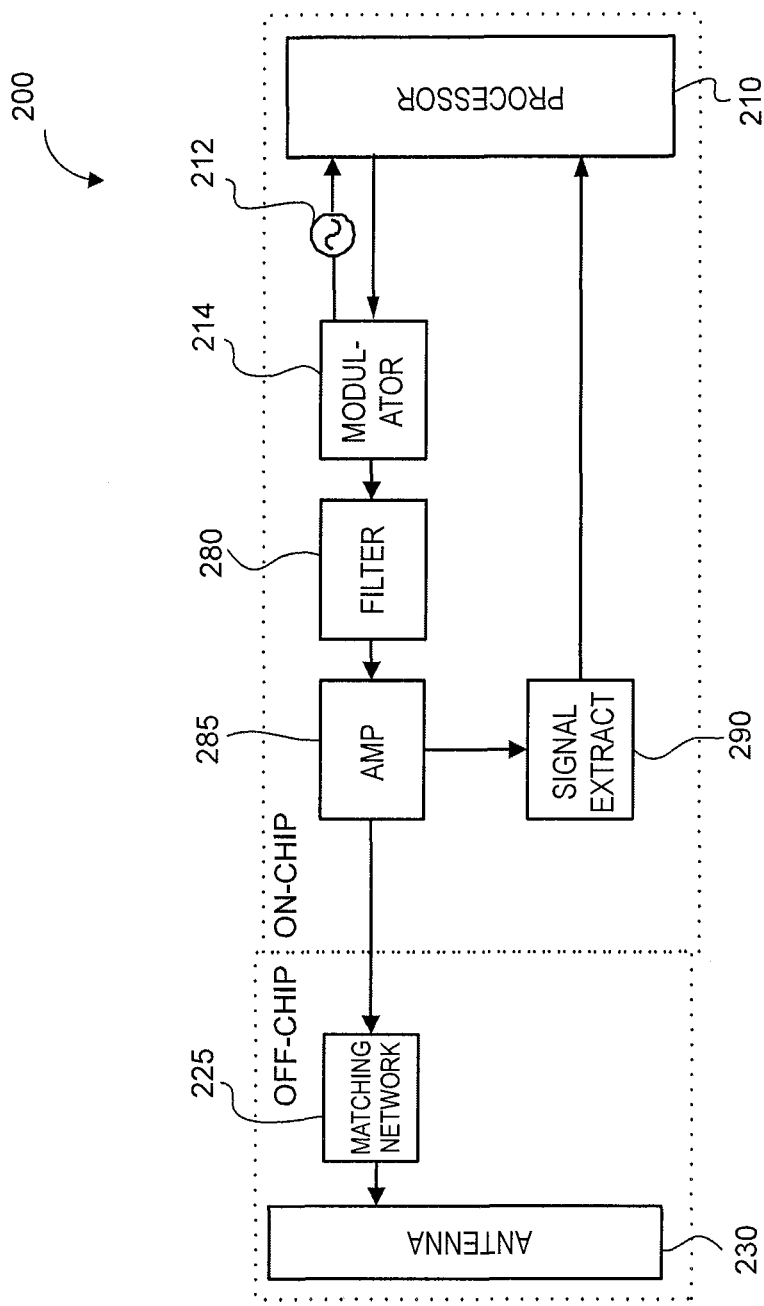
FIG. 2 is a simplified circuit diagram of an example RFID reader in accordance with some embodiments.

Referring now to FIG. 2, there is shown a simplified circuit diagram of an example RFID reader in accordance with some embodiments. RFID reader 200 demonstrates a frontend design that may be used for ISO/IEC 14443 applications. RFID reader 200 may comprise a processor 210, clock signal generator 212, modulator 214, filter 280, amplifier 285, matching network 225, antenna 230 and signal extraction unit 290.

In general, portions of RFID reader 200 may correspond to portions of RFID reader 100. Accordingly, processor 210, clock signal generator 212, modulator 214, matching network 225 and antenna 230 may generally correspond to processor 110, clock signal generator 112, modulator 114, matching network 125 and antenna 130, respectively.

Likewise, processor 210, clock signal generator 212 and modulator 214 may be collectively referred to as a signal generation unit.

RFID reader 200 demonstrates an analog frontend design targeted for ISO/IEC 14443 applications. Under this approach, the receiver of RFID reader 200 replaces the conventional receiver portion of RFID reader 100 (e.g., comprising RX antenna voltage detection using envelope detector 140, amplifier 150, bandpass filter 160 and comparator 170) with signal extraction unit 290, which uses a current sensing element to detect current supplied by amplifier 285. Accordingly, the current sensing element can detect current variations in a transmitted signal when an RFID tag is modulating the electromagnetic field generated by the RFID reader.

In alternative embodiments, if desired, the RFID reader can detect the load modulation by the RFID tag in the conventional manner using an RX input pin as shown in RFID reader 100. However, by sensing current at amplifier 285, the conventional receiver processing stage can be eliminated. Likewise, the RX pin of the antenna can be eliminated or left unused.

If the RX pin is eliminated, filter 280 can be used to eliminate unwanted harmonics of the RF field prior to transmission by the antenna. Filter 280 can be an on-chip low-pass filter, which may be an active filter or a passive filter. The frequency response of filter 280 can be adjusted to compensate for the removal of the conventional EMC filter (e.g., EMC filter 122), and to provide a desired transmission characteristic. Accordingly, the conventional EMC filter (e.g., filter 122) can be removed.

Amplifier 285 can be used to amplify (or buffer) the output of filter 280 and to provide the primary signal for transmission via antenna 230. In some cases, amplifier 285 may be a power amplifier or audio amplifier. For example, amplifier 285 may be a class D audio amplifier.

A current sensor can be used to detect current consumed by the RF field generated by RFID reader 200. In practice, this can be detected, for example, by measuring current drawn or supplied by amplifier 285 (e.g., transmission signal current). In some cases, current may even be measured elsewhere along the signal transmission chain (e.g., at the input of amplifier 285). For ease of exposition, this current measurement will be described as a measurement of current supplied by amplifier 285, however it will be understood that current could be measured at various other points in the signal transmission chain with similar effect.

The current sensor may be integrated into amplifier 285, signal extraction unit 290, or may be a separate element (not shown).

The current level can be detected by, or provided to, a signal extraction unit 290. Signal extraction unit 290 may comprise a suitable filter and signal processing logic for post processing the detected current level to generate an extracted data signal. As described herein, because an RFID tag that is modulating a primary signal draws energy from the electromagnetic field generated by the RFID reader, this load modulation can be detected in the current supplied by amplifier 285.

By eliminating the need for off-chip filters and a RX pin from the antenna, a variety of alternative antenna configurations can be used. For example, an audio speaker comprises a coil, a diaphragm and a magnet. Accordingly, in some embodiments, the speaker coil may be used as the RFID antenna coil. Furthermore, as amplifier 285 can be an audio amplifier, various components of RFID reader 200 may be integrated with and/or shared with an audio output device. This may facilitate easy integration of the RFID reader with the audio units of electronic devices such as cell phones, personal computers, laptops and tablets.

It will be appreciated that for simplicity and clarity of illustration, numerous specific details of the described embodiments are set forth herein primarily with reference to an RFID reader as transmitter and a passive RFID tag as modulating the signal transmitted by the RFID reader. However, the described signal detection approach can also be applied by RFID tags, and active RFID tags in particular. For example, an RFID tag may also transmit a signal, and monitor current supplied by an output amplifier to detect modulation performed by the RFID reader of the signal transmitted by the RFID tag. Likewise, an audio speaker can also be used as an RFID tag antenna.

The invention claimed is:

1. An integrated circuit frontend for use in RFID communication, wherein a data signal is transmitted via load modulation of a primary signal transmitted via an antenna, the frontend comprising:
 a signal generation unit that generates the primary signal, wherein the signal generation unit comprises a modulator, a clock signal generator coupled to the modulator, and a processor coupled to the modulator and the clock signal generator;
 an integrated filter that reduces undesired harmonics in the primary signal;
 an amplifier that amplifies filtered primary signal for transmission via the antenna;
 a sensor coupled to the amplifier; and
 a signal extraction unit which extracts the data signal from the load modulation of the primary signal based on variations in a current level or voltage level of the amplifier detected by the sensor.

2. The integrated circuit frontend of claim 1, wherein the sensor detects the current level supplied by the amplifier.

3. The integrated circuit frontend of claim 1, wherein the integrated filter is a low pass filter.

4. The integrated circuit frontend of claim 1, wherein the amplifier is a class D amplifier.

5. An RFID communication unit for detection of a data signal transmitted by a target device via load modulation of a primary signal, the RFID communication unit comprising:
 a signal generation unit that generates the primary signal, wherein the signal generation unit comprises a modulator, a clock signal generator coupled to the modulator, and a processor coupled to the modulator and the clock signal generator;
 an integrated filter that reduces undesired harmonics in the primary signal;
 an amplifier that amplifies filtered primary signal,
 a sensor coupled to the amplifier;
 an antenna that electromagnetically couples output from the amplifier with the target device;
 a signal extraction unit which extracts the data signal from the load modulation of the primary signal based on variations in current level or voltage level of the amplifier detected by the sensor.

6. The RFID communication unit of claim 5, wherein the sensor detects the current level supplied by the amplifier.

7. The RFID communication unit of claim 5, wherein the signal generation unit, the integrated filter, the amplifier, the sensor and the signal extraction unit are provided on an integrated circuit.

8. The RFID communication unit of claim 5, further comprising a matching network coupled to an input of the antenna.

9. The RFID communication unit of claim 5, wherein the integrated filter is a low pass filter.

10. The RFID communication unit of claim 5, wherein the amplifier is a class D amplifier.

11. The RFID communication unit of claim 5, wherein the antenna is formed by a speaker coil.

* * * * *

UNITED STATES PATENT AND TRADEMARK OFFICE
CERTIFICATE OF CORRECTION

| | | |
|---|---|---|
| PATENT NO. | : 9,070,062 B2 | |
| APPLICATION NO. | : 13/544326 | |
| DATED | : June 30, 2015 | |
| INVENTOR(S) | : Afshin Rezayee | |

It is certified that error appears in the above-identified patent and that said Letters Patent is hereby corrected as shown below:

IN THE CLAIMS

Column 7, Line 22, Claim 1: Please replace "an amplifier that amplifies filtered primary signal for trans-" with -- an amplifier that amplifies the filtered primary signal for trans- --

Column 8, Line 11, Claim 5: Please replace "an amplifier that amplifies filtered primary signal," with -- an amplifier that amplifies the filtered primary signal, --

Signed and Sealed this
Tenth Day of November, 2015

Michelle K. Lee
*Director of the United States Patent and Trademark Office*